United States Patent
Hoshikawa

(10) Patent No.: US 11,924,977 B2
(45) Date of Patent: Mar. 5, 2024

(54) DEVICE AND METHOD FOR INSPECTING ADSORPTION NOZZLE

(71) Applicant: FUJI CORPORATION, Chiryu (JP)

(72) Inventor: Kazumi Hoshikawa, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 88 days.

(21) Appl. No.: 17/629,750

(22) PCT Filed: Jul. 25, 2019

(86) PCT No.: PCT/JP2019/029179
§ 371 (c)(1),
(2) Date: Jan. 24, 2022

(87) PCT Pub. No.: WO2021/014636
PCT Pub. Date: Jan. 28, 2021

(65) Prior Publication Data
US 2022/0256750 A1    Aug. 11, 2022

(51) Int. Cl.
*G01R 31/28*    (2006.01)
*H05K 13/04*    (2006.01)
*H05K 13/08*    (2006.01)

(52) U.S. Cl.
CPC ....... *H05K 13/087* (2018.08); *H05K 13/0409* (2018.08); *H05K 13/0812* (2018.08)

(58) Field of Classification Search
CPC ............. H05K 13/0409; H05K 13/081; H05K 13/0812; H05K 13/087
See application file for complete search history.

(56) References Cited

U.S. PATENT DOCUMENTS

| 6,041,494 | A | 3/2000 | Mimura et al. |
| 10,143,119 | B2 | 11/2018 | Hosaka et al. |
| 10,441,980 | B2 * | 10/2019 | Hoshikawa ............... B08B 3/02 |
| 10,721,847 | B2 * | 7/2020 | Hoshikawa ........... H05K 13/082 |
| 11,065,650 | B2 * | 7/2021 | Hoshikawa ........ H05K 13/0409 |
| 11,202,401 | B2 * | 12/2021 | Ito ....................... H05K 13/0409 |
| 2017/0131215 | A1 | 5/2017 | Hoshikawa et al. |
| 2019/0159373 | A1 | 5/2019 | Kawaguchi et al. |

FOREIGN PATENT DOCUMENTS

| EP | 3 264 071 A1 | 1/2018 |
| JP | 10-13093 A | 1/1998 |
| JP | 4538973 B2 | 9/2010 |
| JP | 2017-74560 A | 4/2017 |
| WO | WO 2016/135910 A1 | 9/2016 |
| WO | WO 2017/077645 A1 | 5/2017 |

OTHER PUBLICATIONS

International Search Report dated Oct. 15, 2019 in PCT/JP2019/029179 filed on Jul. 25, 2019, 2 pages.

* cited by examiner

*Primary Examiner* — Paul D Kim
(74) *Attorney, Agent, or Firm* — Oblon, McClelland, Maier & Neustadt, L.L.P.

(57) ABSTRACT

A device for inspecting a suction nozzle includes an imaging device configured to acquire an image by imaging a flange portion of a suction nozzle having a body cylinder and the flange portion protruding from an outer surface of the body cylinder, and a control device configured to execute an inspection process for determining whether the flange portion is defective based on the image.

9 Claims, 11 Drawing Sheets

DEVICE AND METHOD FOR INSPECTING ADSORPTION NOZZLE

TECHNICAL FIELD

The present disclosure relates to inspection of a suction nozzle having a flange portion protruding from an outer surface of a body cylinder.

BACKGROUND ART

In the conventional art, various techniques for inspecting a suction nozzle have been proposed.

For example, a mounting machine disclosed in Patent Literature 1 includes a mounting head moving device, a mounting head, and a part camera. The mounting head mounts a component on a board. A suction nozzle is attached to a lower surface of the mounting head. The suction nozzle has a body cylinder, a flange portion, and a suction pipe. The suction nozzle picks up and holds a component at a tip of a suction pipe with a negative pressure.

The part camera is attached to a base in a state of facing upward. The mounting machine moves the mounting head to an upper side of the part camera, and captures an image of a component held by the suction nozzle by using the part camera.

PATENT LITERATURE

Patent Literature 1: International Publication No. WO2017/077645

BRIEF SUMMARY

Technical Problem

In a case where the imaging is performed in a state in which a lighting is directed to the component from the part camera side, for example, there is a study that the flange portion of the suction nozzle serving as the background of the component does not reflect light of the lighting by performing black plating treatment. However, in a case where scratches are formed in the flange portion of the suction nozzle, when the lighting light reflected from the scratch portion enters a field of view of the part camera, the contrast between the component and the flange portion of the suction nozzle is reduced, and thus there is concern that image recognition of the component may be influenced.

The present disclosure has been made in view of the above problems, and an object thereof is to provide a device for inspecting a suction nozzle by determining the quality of a flange portion of the suction nozzle through image processing from the viewpoint of improving image recognition of a component held by the suction nozzle.

Solution to Problem

According to the present specification, there is provided a device for inspecting a suction nozzle including an imaging device configured to acquire an image by imaging a flange portion of a suction nozzle having a body cylinder and the flange portion protruding from an outer surface of the body cylinder; and a control device configured to execute an inspection process for determining whether the flange portion is defective based on the image.

Advantageous Effects

According to the present disclosure, the device for inspecting a suction nozzle determines the quality of a flange portion of the suction nozzle through image processing from the viewpoint of improving image recognition of a component held by the suction nozzle.

DESCRIPTION OF EMBODIMENTS

Hereinafter, preferred embodiments of the present disclosure will be described in detail with reference to the drawings.

Figure 1:
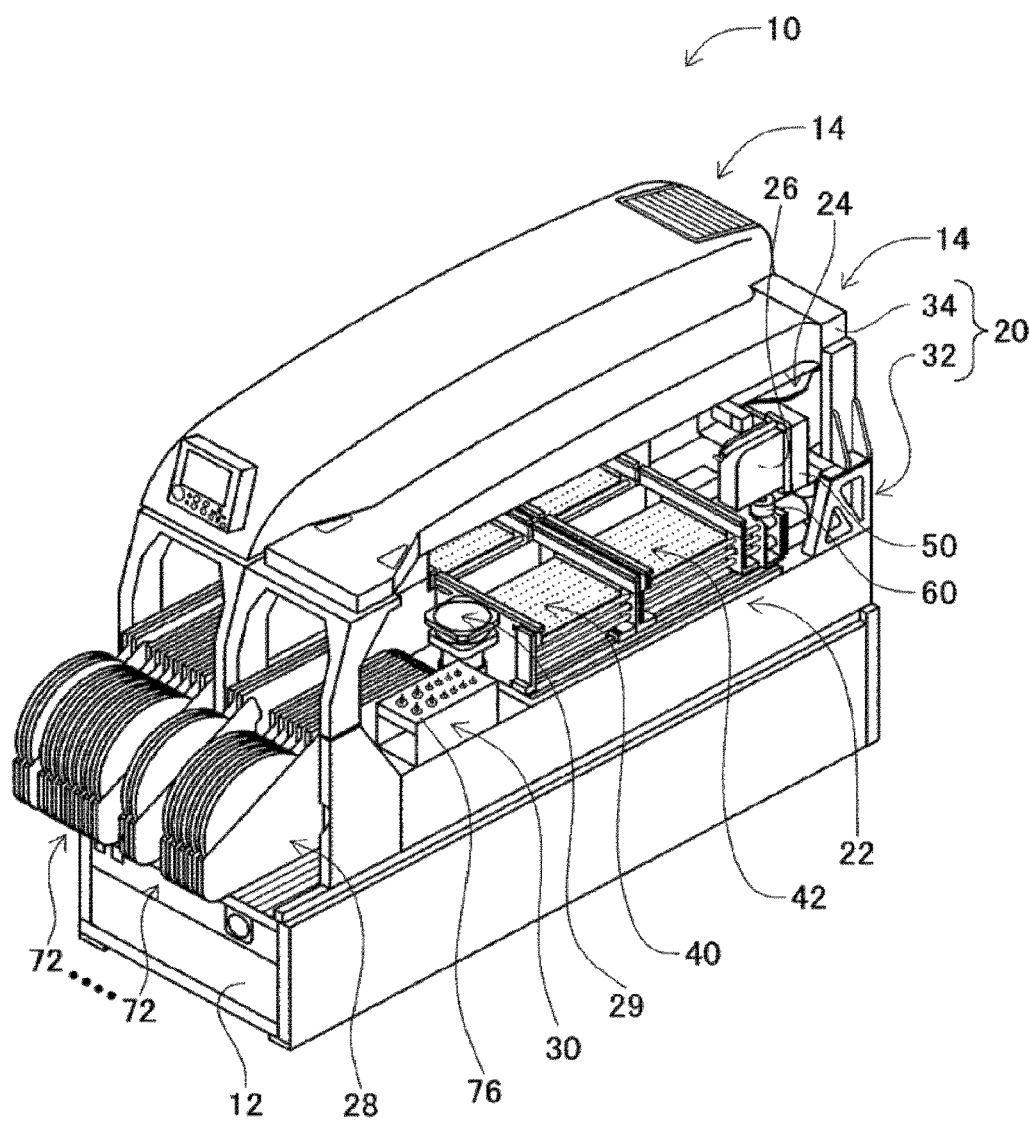
FIG. 1 is a perspective view illustrating an electronic component mounting device.

FIG. 1 illustrates electronic component mounting device 10. First, a configuration of electronic component mounting device 10 will be described. Electronic component mounting device 10 includes single system base 12 and two electronic component mounters (hereinafter, sometimes abbreviated to "mounters") 14 adjacent above system base 12. A direction in which mounters 14 are arranged will be referred to as an X-axis direction, and a horizontal direction perpendicular to the X-axis direction will be referred to as a Y-axis direction.

Each mounter 14 mainly includes mounter main body 20, conveyance device 22, a mounting head moving device (hereinafter, sometimes abbreviated to a moving device) 24, mounting head 26, supply device 28, part camera 29, and nozzle station 30. Mounter main body 20 includes frame portion 32 and beam portion 34 that is suspended on frame portion 32.

Conveyance device 22 includes two conveyor devices 40 and 42. Two conveyor devices 40 and 42 are disposed parallel to each other and in such a manner as to extend in the X-axis direction on frame portion 32. Each of two conveyor devices 40 and 42 conveys a circuit board supported at each of conveyor devices 40 and 42 in the X-axis direction with an electromagnetic motor (not illustrated). The circuit board is held by a board holding device (not illustrated) at a predetermined position.

Moving device 24 is an XY-robot type moving device. Moving device 24 includes an electromagnetic motor (not illustrated) that causes slider 50 to slide in the X-axis direction, and an electromagnetic motor (not illustrated) that causes slider 50 to slide in the Y-axis direction. Mounting head 26 is attached to slider 50, and mounting head 26 is moved to any position on frame portion 32 due to operations of the two electromagnetic motors.

Figure 2:
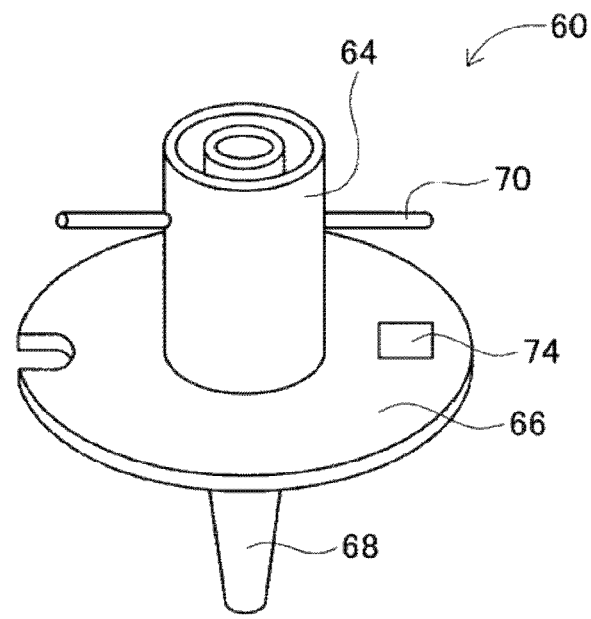
FIG. 2 is a perspective view illustrating a suction nozzle.
Figure 3:
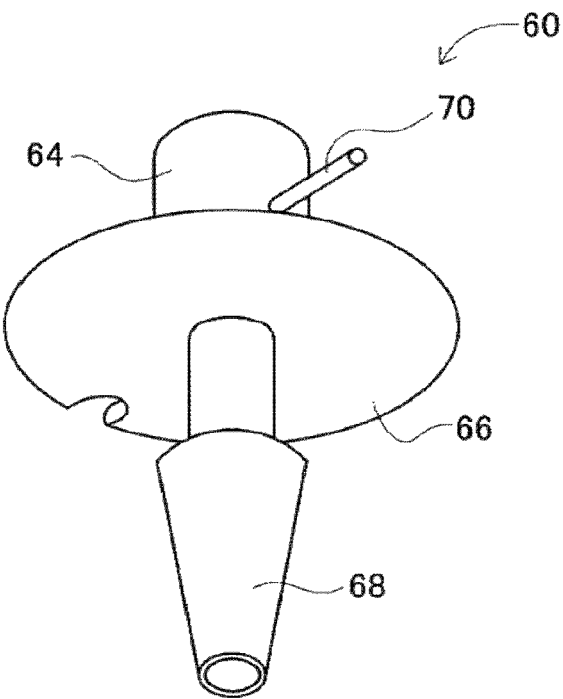
FIG. 3 is a perspective view illustrating the suction nozzle.

Mounting head 26 mounts an electronic component on a circuit board. Suction nozzle 60 is provided at a lower end face of mounting head 26. As illustrated in FIG. 2 and FIG. 3, suction nozzle 60 is configured by body cylinder 64, flange portion 66, suction pipe 68, and locking pin 70. Body cylinder 64 has a cylindrical shape, and flange portion 66 is fixed to protrude from an outer circumferential surface of body cylinder 64. In flange portion 66, black plating treatment is performed on a lower surface thereof (a surface on the side of suction pipe 68). Suction pipe 68 has a thin pipe shape, and is held by body cylinder 64 so as to be movable in an axial direction in a state of extending downward from a lower end part of body cylinder 64. Locking pin 70 is provided at an upper end part of body cylinder 64 so as to extend in a radial direction of body cylinder 64. Suction nozzle 60 is detachably attached to mounting head 26 by one touch by using locking pin 70. Locking pin 70 is not illustrated in FIGS. 6 and 8 that will be described later. A spring (not illustrated) is built into mounting head 26, and the spring applies elastic force to suction pipe 68 of suction nozzle 60 attached to mounting head 26. Consequently, suction pipe 68 is biased in a direction extending downward from the lower end part of body cylinder 64 by the elastic force of the spring built into mounting head 26. 2D code 74 is attached to an upper surface of flange portion 66. 2D code 74 indicates an identification (ID) or the like of suction nozzle 60 as individual information. Instead of 2D code 74, a barcode or an RF tag may be attached to the upper surface of flange portion 66. However, in a case where the RF tag is attached to the upper surface of flange portion 66, a reader for acquiring individual information from the RF tag is attached to transfer head (refer to FIG. 5) 120 of nozzle management device (refer to FIG. 4) 80 that will be described later.

Suction nozzle 60 communicates with positive and negative pressure supply devices (not illustrated) via a negative pressure air passage and a positive pressure air passage. Suction nozzle 60 picks up and holds an electronic component by using a negative pressure at a lower end face of suction pipe 68, and separates the held electronic component by using a positive pressure. Mounting head 26 has a nozzle lifting/lowering device (not illustrated) that lifts and lowers suction nozzle 60. The nozzle lifting/lowering device changes a position of the electronic component held by mounting head 26 in the up-down direction.

Supply device 28 is a feeder-type supply device, and includes multiple tape feeders 72 as illustrated in FIG. 1. Tape feeder 72 accommodates taped components that are wound therearound. The taped component is obtained by taping an electronic component. Tape feeder 72 causes a feeding device (not illustrated) to feed the taped component. Consequently, feeder-type supply device 28 supplies an electronic component at a supply position by feeding a taped component.

Part camera 29 is disposed in frame portion 32 so as to face upward between conveyance device 22 and supply device 28.

Nozzle station 30 includes nozzle tray 76. Nozzle tray 76 accommodates multiple suction nozzles 60. In nozzle station 30, suction nozzle 60 attached to mounting head 26 and suction nozzle 60 accommodated in nozzle tray 76 are exchanged as required. Nozzle tray 76 is detachable from nozzle station 30, and thus collection of suction nozzle 60 accommodated in nozzle tray 76, provision of suction nozzle 60 to nozzle tray 76, and the like can be performed outside mounter 14.

Next, mounting work using mounter 14 will be described. In mounter 14, with the configuration described above, mounting work can be executed on a circuit board held by conveyance device 22 by using mounting head 26. Specifically, a circuit board is conveyed to a work position according to a command from a control device (not illustrated) of mounter 14, and is held by the board holding device at that position. Tape feeder 72 feeds a taped component according to a command from the control device, and supplies an electronic component at a supply position. Mounting head 26 is moved above the supply position of the electronic component, and picks up and holds the electronic component at the lower end face of suction pipe 68 of suction nozzle 60. Subsequently, mounting head 26 is moved above part camera 29, and thus the electronic component picked up and held by the lower end face of suction pipe 68 of suction nozzle 60 is imaged by part camera 29. In this case, part camera 29 intensely illuminates suction nozzle 60 with lighting light from below (on the side of part camera 29) in the same manner as camera 140 (refer to FIG. 5) that will be described later. Consequently, information regarding a holding position or the like of the electronic component can be obtained. Thereafter, mounting head 26 is moved above the circuit board, and mounts the electronic component held thereby on a circuit board.

In mounter 14, as described above, an electronic component supplied by tape feeder 72 is picked up and held at the lower end face of suction pipe 68 of suction nozzle 60, and thus the electronic component is mounted on the circuit board. Thus, in a case where a failure has occurred in suction nozzle 60, since there is concern that the mounting work may not be appropriately performed, it is necessary to appropriately manage suction nozzle 60. Therefore, suction nozzle 60 is managed by a nozzle management device described below.

Figure 4:
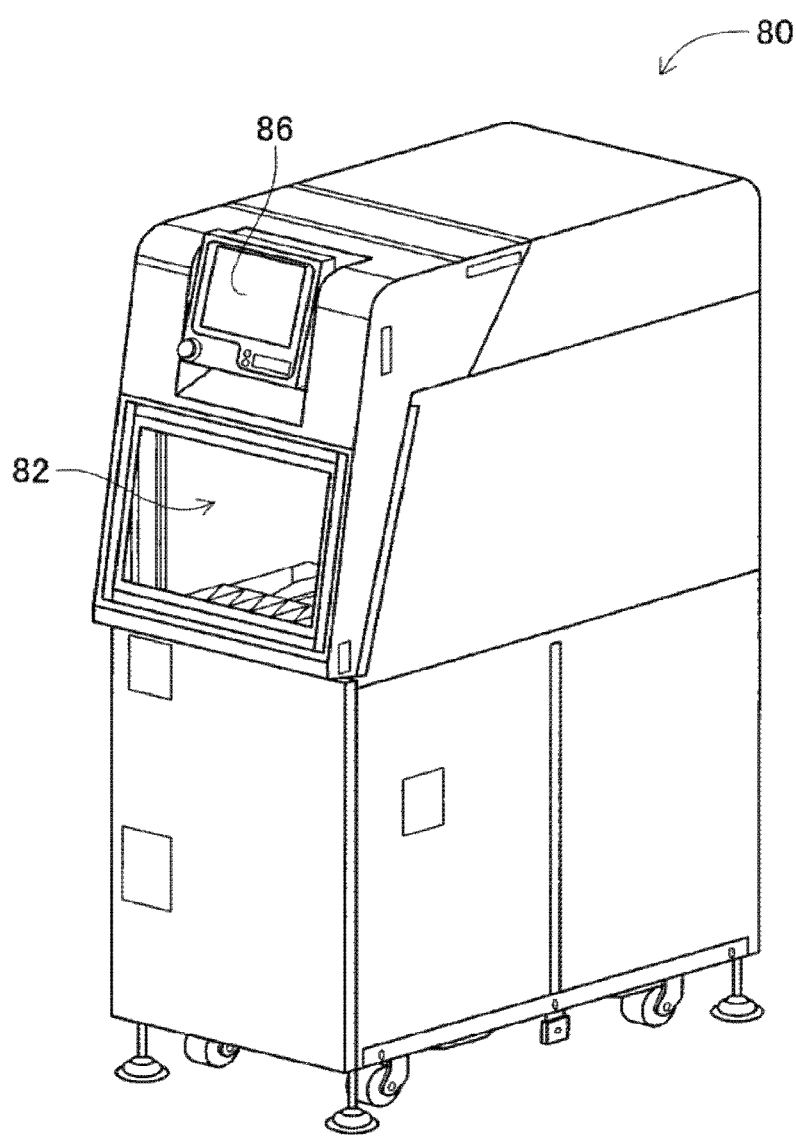
FIG. 4 is a perspective view illustrating an external appearance of a nozzle management device.

Next, a configuration of the nozzle management device will be described. As illustrated in FIG. 4, nozzle management device 80 has a generally rectangular parallelepiped shape, and is provided with door 82 through which nozzle tray 76 is stored in nozzle management device 80 or nozzle tray 76 is extracted from nozzle management device 80 on a front surface thereof. Touch panel 86 or the like that displays various pieces of information and is used to perform each operation is disposed above door 82.

Figure 5:
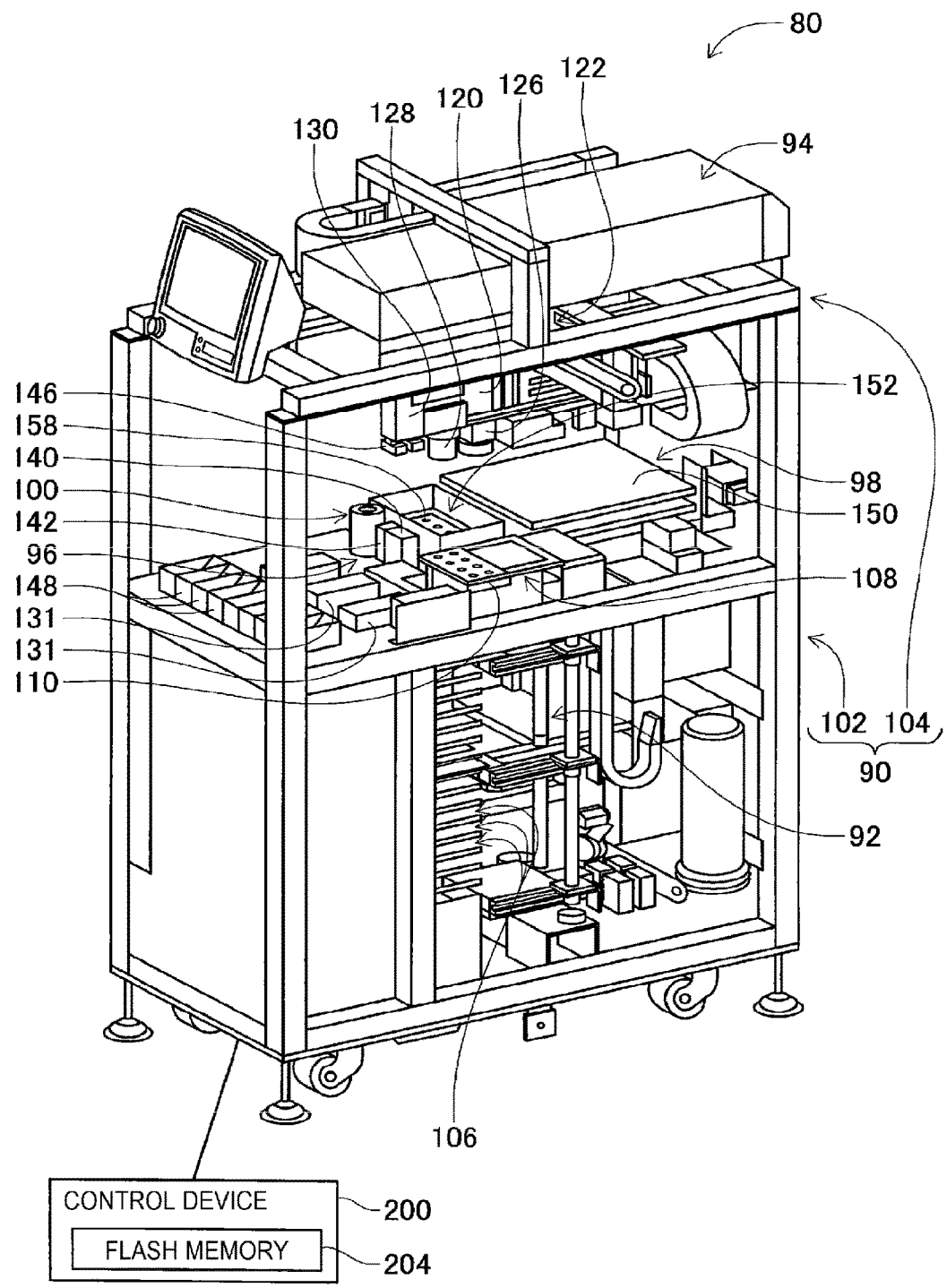
FIG. 5 is a perspective view illustrating an internal structure of the nozzle management device.

As illustrated in FIG. 5, nozzle management device 80 includes management device main body 90, pallet accommodation device 92, nozzle transfer device 94, nozzle inspection device 96, nozzle cleaning device 98, and nozzle drying device 100. FIG. 5 is a perspective view illustrating a state in which an outer shell member of nozzle management device 80 is detached, and illustrates an internal structure of nozzle management device 80. Control device 200 is connected to nozzle management device 80. Control device 200 includes flash memory 204. Details of control device 200 will be described later.

Management device main body 90 includes frame portion 102 and beam portion 104 suspended on frame portion 102. Frame portion 102 has a hollow structure, pallet accommodation device 92 is disposed in frame portion 102, and an upper end part of pallet accommodation device 92 is exposed on an upper surface of frame portion 102.

Pallet accommodation device 92 includes multiple pallet placement shelves 106 and support arm 108. Pallet placement shelf 106 is a shelf on which nozzle pallet 110 is placed, and multiple pallet placement shelves 106 are disposed to be arranged in the up-down direction inside frame portion 102. Nozzle pallet 110 accommodates multiple suction nozzles 60. Support arm 108 is moved in the up-down direction ahead of multiple pallet placement shelves 106 and approaches and separates from pallet placement shelves 106 due to an operation of an arm moving device (not illustrated). Consequently, storage of nozzle pallet 110 into pallet placement shelf 106 and extraction of nozzle pallet 110 from pallet placement shelf 106 are performed by support arm 108. Nozzle pallet 110 extracted from pallet placement shelf 106 is moved above frame portion 102 due to upward movement of support arm 108.

Nozzle transfer device 94 is a device that transfers suction nozzle 60 between nozzle tray 76 and nozzle pallet 110, and is disposed in beam portion 104. Nozzle transfer device 94 includes transfer head 120 and head moving device 122. Camera 126 in a state of facing downward, holding chuck 128 that holds suction nozzle 60, and air supply device 130 are attached to a lower end face of transfer head 120.

Figure 6:
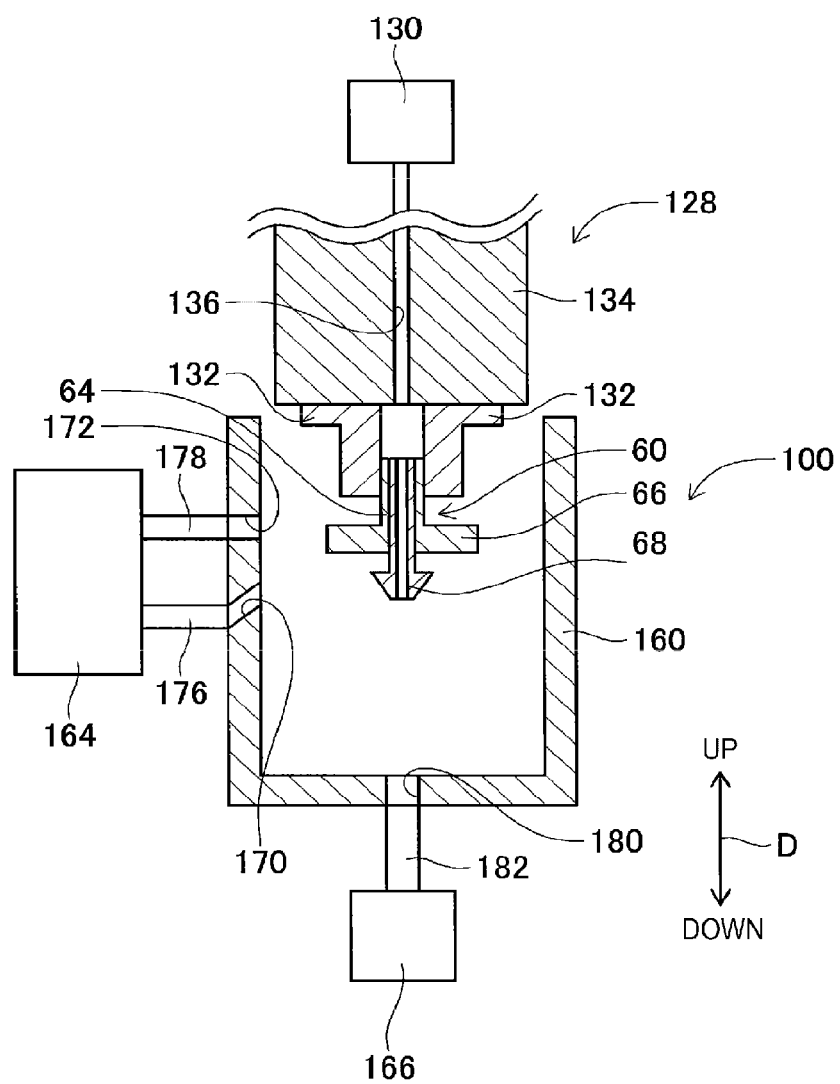
FIG. 6 is a sectional view illustrating a nozzle drying device.

As illustrated in FIG. 6, holding chuck 128 has three holding pawls 132, and by causing three holding pawls 132 to approach each other, suction nozzle 60 is held in body cylinder 64, and by causing three holding pawls 132 to separate from each other, held suction nozzle 60 is released. Air flow path 136 is formed in main body portion 134 of holding chuck 128. A lower end part of air flow path 136 is open between three holding pawls 132, and an upper end part thereof is connected to air supply device 130. Thus, in a state in which holding chuck 128 holds suction nozzle 60, air is supplied to air flow path 136 by air supply device 130, and thus air is blown out from the lower end part of air flow path 136 toward the inside of suction nozzle 60. Consequently, air is blown into the inside of suction nozzle 60, and thus air is blown from the tip portion of suction pipe 68. Holding chuck 128 has pivot device 138 (refer to FIG. 7) that pivots itself. Consequently, suction nozzle 60 held by holding chuck 128 is rotated. The number of holding pawls 132 may be two. In FIG. 6, the direction of the reference sign D indicates the up-down direction.

As illustrated in FIG. 5, head moving device 122 is an XYZ type moving device that moves transfer head 120 in the front-rear direction, the left-right direction, and the up-down direction on frame portion 102. Fixing stage 131 for setting nozzle tray 76 is provided on an upper surface of the front side of frame portion 102, and suction nozzle 60 is transferred between nozzle tray 76 set on fixing stage 131 and nozzle pallet 110 supported by support arm 108 of pallet accommodation device 92.

Nozzle inspection device 96 includes camera 140, load cell 142, and joint 146. Camera 140 is disposed on the upper surface of frame portion 102 so as to face upward, and the lower end face of suction pipe 68 of suction nozzle 60 is inspected by using camera 140. Specifically, suction nozzle 60 that is an inspection target is held by holding chuck 128, and suction nozzle 60 held by holding chuck 128 is imaged by camera 140 from below. The imaging is performed in a state in which the lower end face of suction pipe 68 of suction nozzle 60 is focused. Consequently, imaging data of the lower end face of suction pipe 68 of suction nozzle 60 is obtained, and a state of the lower end face of suction pipe 68 of suction nozzle 60 is inspected based on the imaging data. Although a lower surface state of flange portion 66 of suction nozzle 60 is inspected based on the imaging data or imaging data obtained anew, the inspection and details of camera 140 will be described later.

Load cell 142 is disposed near camera 140, and expansion and contraction states of the tip portion of suction nozzle 60 are inspected by using load cell 142. Specifically, suction nozzle 60 that is an inspection target is held by holding chuck 128, and the tip portion of suction nozzle 60 held by holding chuck 128 comes into contact with load cell 142. The tip portion of suction nozzle 60 is allowed to expand and contract, and thus the expansion and contraction states of the tip portion of suction nozzle 60 are inspected based on a load measured by load cell 142.

Joint 146 is disposed on a lower surface of air supply device 130, and air is supplied thereto from air supply device 130. An air flow rate of suction nozzle 60 is inspected by using the air supplied from air supply device 130 to joint 146. Specifically, joint 146 is moved above suction nozzle 60 placed on cleaning pallet 158 that will be described later due to an operation of head moving device 122. Joint 146 is connected to suction nozzle 60 that is an inspection target, and thus air is supplied from air supply device 130. In this case, an air pressure is measured, and an air flow rate of suction nozzle 60 is inspected based on the air pressure.

Multiple discard boxes 148 are disposed on the upper surface of frame portion 102, and suction nozzle 60 determined as being a defective nozzle through the inspection is discarded into discard box 148. Suction nozzle 60 determined as being a normal nozzle through the above inspection is returned to nozzle tray 76 or nozzle pallet 110.

Nozzle cleaning device 98 is a device that cleans and dries suction nozzle 60, and is disposed near pallet accommodation device 92. Nozzle cleaning device 98 includes cleaning/drying mechanism 150 and cleaning pallet moving mechanism 152. Cleaning/drying mechanism 150 is a mechanism that cleans and dries suction nozzle 60 in the inside thereof. Cleaning pallet moving mechanism 152 is a mechanism that moves cleaning pallet 158 between an exposure position where cleaning pallet 158 is exposed (a position where cleaning pallet 158 is illustrated in FIG. 5) and the inside of cleaning/drying mechanism 150.

Nozzle drying device 100 is a device that dries suction nozzle 60, and is disposed near cleaning pallet 158 located at the exposure position. As illustrated in FIG. 6, nozzle drying device 100 includes housing 160, first air blow device 164, and second air blow device 166. Housing 160 generally has a cylindrical shape with a bottom.

First air blow device 164 is a device that blows air toward the inside of housing 160. Specifically, two through-holes 170 and 172 are formed in a side wall of housing 160. First through-hole 170 penetrates through the side wall of housing 160 so as to extend in the radial direction of housing 160. First through-hole 170 penetrates obliquely upward from an outer wall surface to an inner wall surface of housing 160. On the other hand, second through-hole 172 penetrates through the side wall of housing 160 so as to extend in the radial direction and the horizontal direction of housing 160 above first through-hole 170. First air blow device 164 is connected to first through-hole 170 and second through-hole 172 via pipes 176 and 178. Consequently, first air blow device 164 blows air toward the inside of housing 160 via through-holes 170 and 172. Second air blow device 166 is a device that blows air toward the inside of housing 160. Specifically, one through-hole 180 is formed in the center of the bottom wall of housing 160. Second air blow device 166 is connected to through-hole 180 via pipe 182. Consequently, second air blow device 166 blows air toward the inside of housing 160 via through-hole 180.

Next, cleaning and drying of suction nozzle 60 will be described. When suction nozzle 60 is cleaned by nozzle cleaning device 98, suction nozzle 60 that is a cleaning target is transferred from nozzle tray 76 or nozzle pallet 110 to cleaning pallet 158 by nozzle transfer device 94. Cleaning pallet 158 is moved to the inside of cleaning/drying mechanism 150 due to an operation of cleaning pallet moving mechanism 152, and suction nozzle 60 is cleaned and dried in the inside of cleaning/drying mechanism 150. When the cleaning and drying of suction nozzle 60 by cleaning/drying mechanism 150 are completed, cleaning pallet 158 is moved to the exposure position due to an operation of cleaning pallet moving mechanism 152.

In nozzle management device 80, when the cleaning and drying of suction nozzle 60 by cleaning/drying mechanism 150 are completed, suction nozzle 60 is dried by using nozzle drying device 100. Specifically, suction nozzle 60 cleaned and dried by cleaning/drying mechanism 150 is held by holding chuck 128 from cleaning pallet 158. Next, holding chuck 128 is moved above nozzle drying device 100 and is lowered due to an operation of head moving device 122. Consequently, suction nozzle 60 held by holding chuck 128 is inserted into the inside of housing 160 of nozzle drying device 100, as illustrated in FIG. 6. Holding chuck 128 is lowered to a position where flange portion 66 and suction pipe 68 of suction nozzle 60 are located in the lateral direction of through-holes 170 and 172. Consequently, in housing 160, suction nozzle 60 held by holding chuck 128 is stored in a state of vertically facing suction pipe 68.

Thereafter, suction nozzle 60 is rotated in housing 160, and thus air is blown from at least one of through-holes 170, 172, and 180 and air flow path 136. As described above, by blowing air to the inside (particularly, suction pipe 68) of suction nozzle 60 from the lateral side, the upper side, or the lower side of suction nozzle 60 inserted in housing 160 and rotating suction nozzle 60, it is possible to appropriately remove moisture remaining between body cylinder 64 and suction pipe 68.

Suction nozzle 60 of which drying by nozzle drying device 100 has been completed is returned to either nozzle tray 76 or nozzle pallet 110 due to an operation of head moving device 122.

Figure 7:
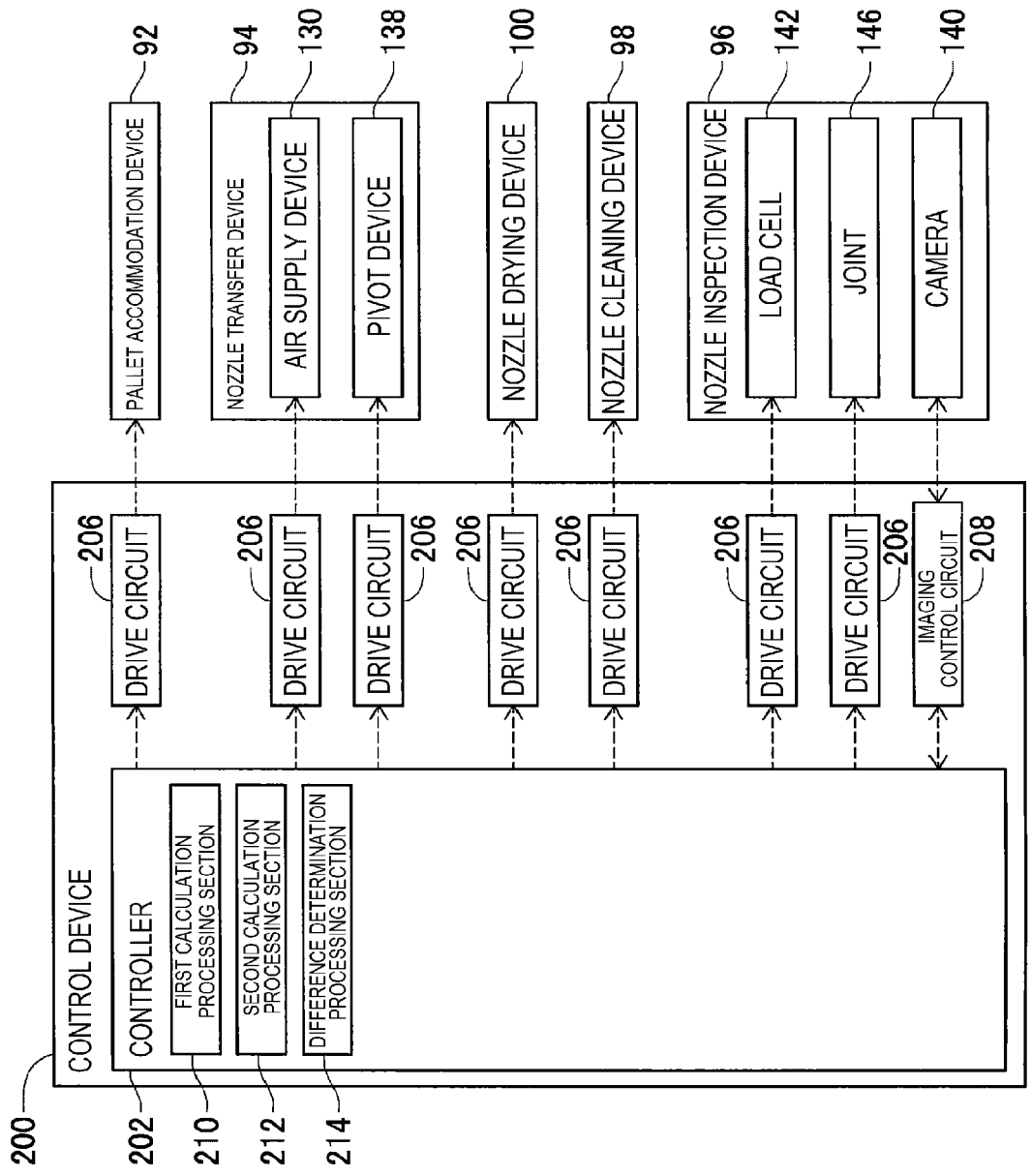
FIG. 7 is a block diagram illustrating a control device provided in the nozzle management device.

As illustrated in FIG. 7, nozzle management device 80 includes control device 200 described above. Control device 200 includes controller 202, multiple drive circuits 206, and imaging control circuit 208. Multiple drive circuits 206 are connected to pallet accommodation device 92, nozzle cleaning device 98, nozzle drying device 100, load cell 142, and joint 146. Imaging control circuit 208 is connected to camera 140. Controller 202 includes a CPU, a ROM, a RAM, and the like, and is mainly a computer, and is connected to multiple drive circuits 206 and imaging control circuit 208. Consequently, operations of pallet accommodation device 92, nozzle transfer device 94, nozzle inspection device 96, nozzle cleaning device 98, nozzle drying device 100, and the like are controlled by controller 202. Controller 202 has first calculation processing section 210, second calculation processing section 212, and difference determination processing section 214 as functional sections for inspecting a lower surface state of flange portion 66 of suction nozzle 60, and details thereof will be described later.

Figure 8:
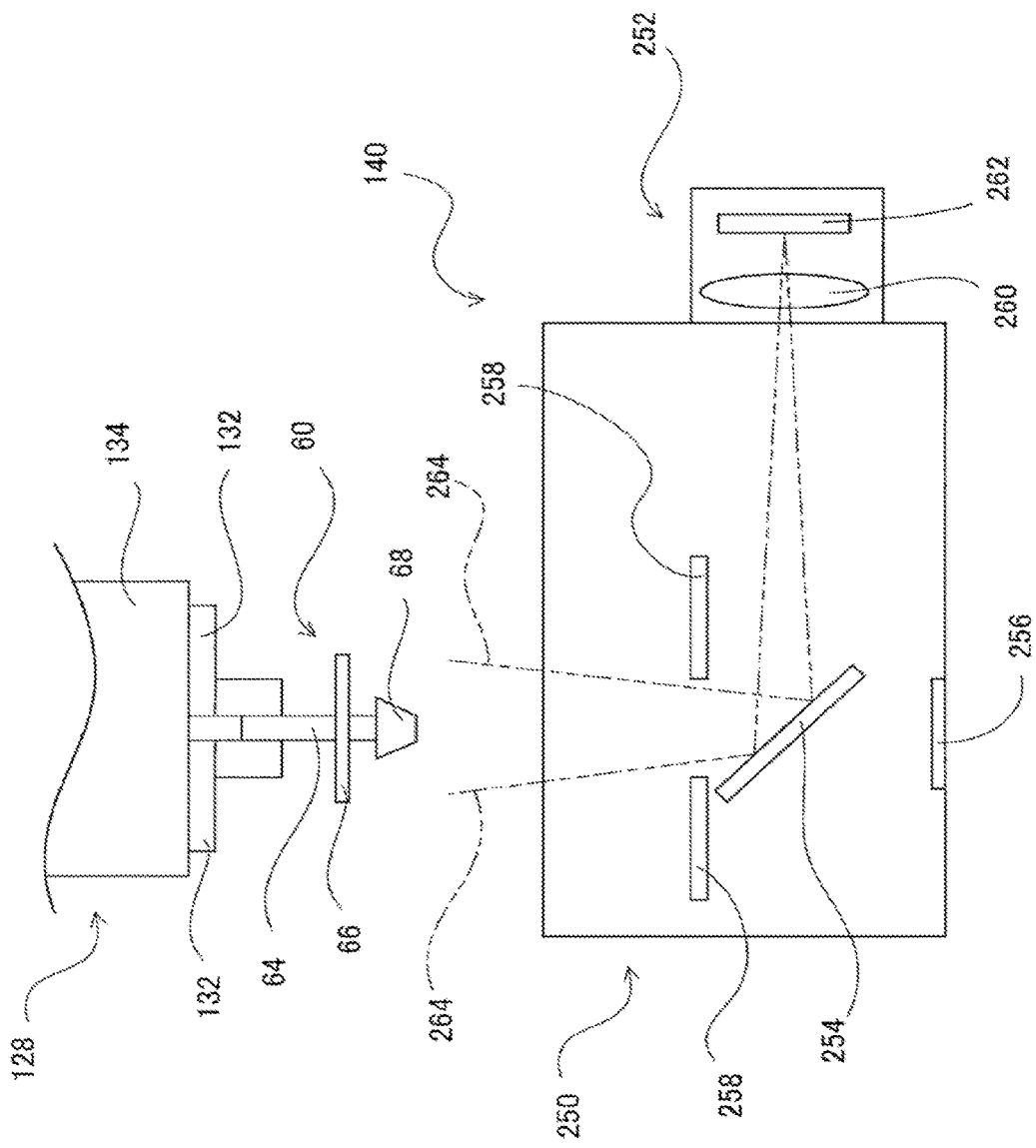
FIG. 8 is a schematic diagram illustrating a camera.

Next, a configuration of camera 140 will be described. Camera 140 is an exchangeable camera unit, and, as illustrated in FIG. 8, includes lighting portion 250 that irradiates suction nozzle 60 held by holding chuck 128 with light from below, and imaging portion 252 that images suction nozzle 60 based on received light.

Lighting portion 250 includes half mirror 254, vertical illumination device 256, and side illumination device 258. Half mirror 254 is disposed in a state of being inclined at approximately 45 degrees, and transmits light incident from below and reflects light incident from above to the right side. Vertical illumination device 256 is disposed below half mirror 254 in a state of facing upward. Side illumination device 258 is generally bowl-shaped with a center opening and is disposed above half mirror 254 in a state of facing upward. Consequently, light from side illumination device 258 is strongly applied to suction nozzle 60 held by holding chuck 128 from an oblique lower side thereof. On the other hand, light from vertical illumination device 256 passes through the center opening of side illumination device 258 after being transmitted through half mirror 254, and is strongly applied to suction nozzle 60 held by holding chuck 128 from immediately below.

Imaging portion 252 is disposed on the right of half mirror 254 and includes lens 260 and imaging element 262. When the light from vertical illumination device 256 and side illumination device 258 is reflected by the lower end face of suction pipe 68 of suction nozzle 60 held by holding chuck 128, the light passes through the center opening of side illumination device 258 along an optical path (a path between two dotted lines 264), enters half mirror 254 to be reflected to the right side, and is thus detected by imaging element 262 via lens 260.

As described above, camera 140 is connected to imaging control circuit 208. Imaging control circuit 208 outputs a control signal to lighting portion 250 to control irradiation of light from lighting portion 250, outputs a control signal to imaging portion 252 to perform imaging, or outputs imaging data generated by imaging portion 252 to controller 202. A state of the lower end face of suction pipe 68 of suction nozzle 60 is inspected by analyzing the imaging data in controller 202. Since the light detected by imaging element 262 is light reflected by the lower end face of suction pipe 68, the lower end face of suction pipe 68 is shown bright in an image. On the other hand, the lower surface of flange portion 66 of suction nozzle 60 is subjected to the black plating treatment and does not reflect light, and is thus shown dark in an image.

Next, inspection of the lower surface state of flange portion 66 of suction nozzle 60 (hereinafter, sometimes abbreviated to flange inspection) performed by nozzle management device 80 will be described. In electronic component mounting device 10, as described above, information regarding a holding position or the like of an electronic component is obtained by imaging the electronic component picked up and held by the lower end face of suction pipe 68 of suction nozzle 60 with part camera 29. In this case, part camera 29 of electronic component mounting device 10 strongly illuminates suction nozzle 60 with lighting light from below (on the side of part camera 29) in the same manner as camera 140 of nozzle management device 80. Thus, in an image acquired by part camera 29 of electronic component mounting device 10, the electronic component picked up and held by the lower end face of suction pipe 68 of suction nozzle 60 and a lead wire thereof are shown bright, and the lower surface of flange portion 66 of suction nozzle 60 serving as the background of the electronic component is shown dark.

However, for example, when the black plating is peeled off due to scratches or the like on the lower surface of flange portion 66 of suction nozzle 60, the lighting light is reflected from the peeled location. When imaging is performed in a state in which the reflected light falls within the field of view of part camera 29 of electronic component mounting device 10, there is concern that the contrast between the electronic component picked up and held by the lower end face of suction pipe 68 of suction nozzle 60, the lead wire thereof, and flange portion 66 of suction nozzle 60 may be low in an image through the imaging, and thus information regarding a holding position or the like of the electronic component may not be obtained.

In view of this, in nozzle management device 80, an image in which the lower end face of suction pipe 68 of suction nozzle 60 is in focus is acquired by camera 140, and a lower surface state of flange portion 66 of suction nozzle 60 is inspected based on the image. In the inspection, when it is determined that the lower surface state of flange portion 66 of suction nozzle 60 is abnormal, suction nozzle 60 that is a determination target is a defective nozzle for which information regarding the holding position or the like of the electronic component cannot be obtained by electronic component mounting device 10, and is discarded to discard box 148.

In order to realize such flange inspection, nozzle management device 80 acquires and stores a reference value. Specifically, suction nozzle 60 in a state in which the lower surface of flange portion 66 is normal (hereinafter, referred to as a non-defective suction nozzle 60) is held by holding chuck 128, and non-defective suction nozzle 60 held by holding chuck 128 is imaged by camera 140 from below. The imaging is performed in a state in which the lower end face of suction pipe 68 of non-defective suction nozzle 60 is focused under predetermined exposure conditions (for example, an F-number of camera 140, a shutter speed, and an intensity of lighting light set in advance by an operator on touch panel 86 or the like.

Figure 9:
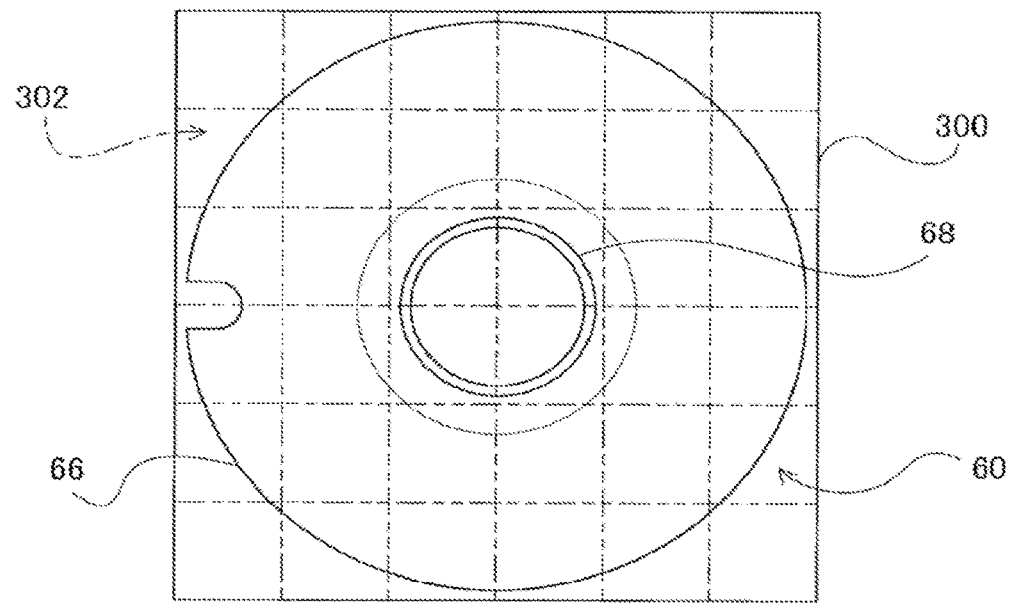
FIG. 9 is a conceptual diagram illustrating an image acquired by the camera.

Consequently, for example, as illustrated in FIG. 9, image 300 on which non-defective suction nozzle 60 is captured is acquired. In addition to the lower end face of suction pipe 68 in a focused state, the lower surface or the like of flange portion 66 in a defocused state is captured on image 300. Image 300 is equally divided into multiple regions 302 by the number of vertical divisions and the number of horizontal divisions. The number of vertical divisions and the number of horizontal divisions are stored in flash memory 204 by being set in advance by an operator via touch panel 86 or the like. In FIG. 9, both the number of vertical divisions and the number of horizontal divisions are six, and thus image 300 is equally divided into 36 regions 302.

Figure 10:
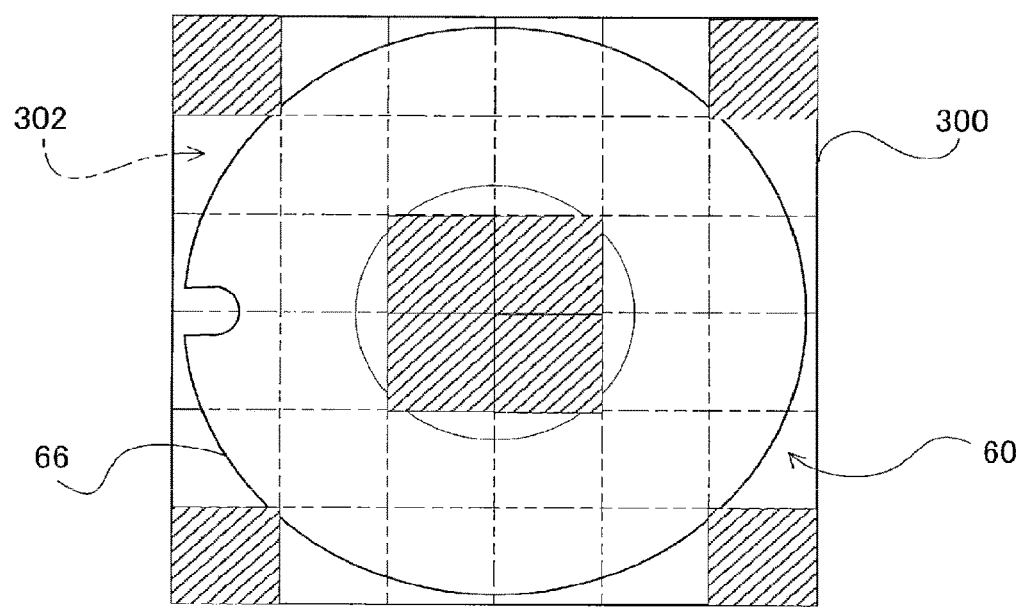
FIG. 10 is a conceptual diagram illustrating an image acquired by the camera.

In image 300, region 302 in which the lower surface of flange portion 66 is hardly captured is excluded from a target of the flange inspection. Specifically, for example, as illustrated in FIG. 10, the outside of flange portion 66 is mostly captured in four regions 302 (filled in with hatched patterns) at the four corners of image 300. The lower end face of suction pipe 68 and the inside of suction pipe 68 are mostly captured in four regions 302 (filled with hatched patterns) located at the center of image 300. Therefore, four regions 302 (filled in with the hatched pattern) at the four corners of image 300 and four regions 302 (filled in with the hatched pattern) at the center of image 300 are specified by the operator via touch panel 86 or the like, and are thus excluded from targets of the flange inspection.

An angle of view of camera 140 is set such that any electronic component that can be picked up and held by the lower end face of suction pipe 68 of suction nozzle 60 is captured in a state in which the electronic component is picked up and held by the lower end face of suction pipe 68 of suction nozzle 60. That is, the angle of view of camera 140 is adjusted to a size of the maximum electronic component among electronic components that can be picked up and held by the lower end face of suction pipe 68 of suction nozzle 60. However, such a size of the maximum electronic component is determined according to a diameter of suction pipe 68 of suction nozzle 60. Thus, in image 300, region 302 to be excluded from a target of the flange inspection differs depending on the type of suction nozzle 60.

Figure 11:
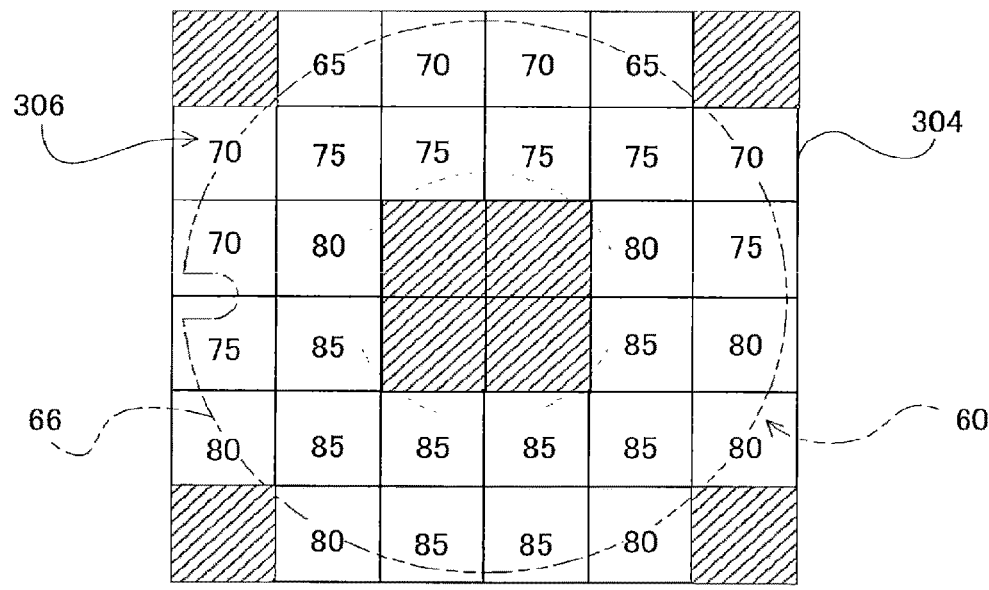
FIG. 11 is a conceptual diagram illustrating a reference table.

Subsequently, for each of multiple regions 302, an average value of brightness values of image 300 is calculated based on the imaging data of image 300. Each calculated average value is stored as a reference value in flash memory 204 in a state of being associated with each of multiple regions 302. Specifically, for example, reference table 304 illustrated in FIG. 11 is provided in flash memory 204. Reference table 304 includes multiple fields 306 corresponding to multiple regions 302. An average value of the brightness values of image 300 in region 302 corresponding to each field 306 is stored in each field 306. In the above-described way, by setting a reference value for each of multiple regions 302 forming image 300, the influence of shading caused by characteristics of lighting portion 250 and imaging portion 252 of camera 140 or the like can be eliminated.

In each field 306 illustrated in FIG. 11, an example of an average value of brightness values of image 300 in a case where the brightness values of image 300 are represented by values (8 bits) of 0 (dark) to 255 (bright) is written. In reference table 304 illustrated in FIG. 11, flange portion 66 of non-defective suction nozzle 60 is indicated by a two-dot chain line, and thus a correspondence between each field 306 and flange portion 66 (region 302 of image 300) of non-defective suction nozzle 60 is shown.

Figure 12:
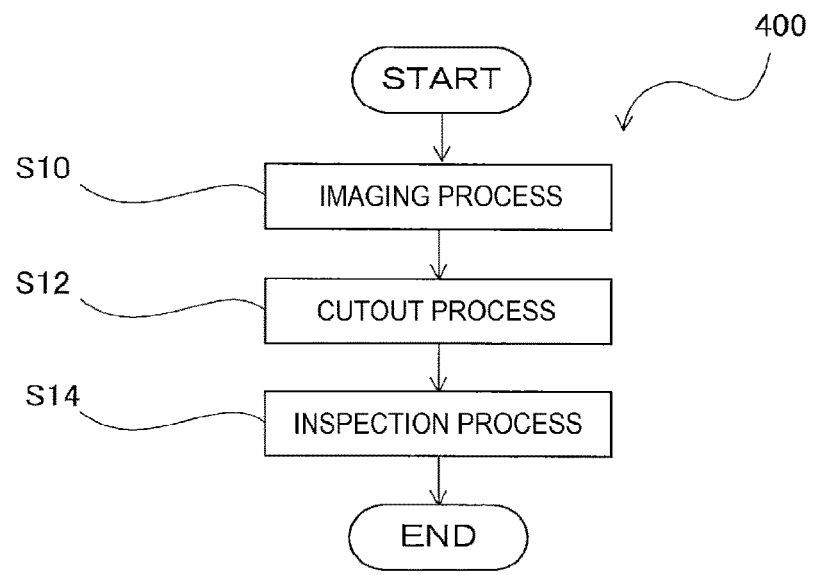
FIG. 12 is a flowchart illustrating a control program in a flange inspection method.

The inspection of the lower surface state of flange portion 66 of suction nozzle 60 is executed by a control program for flange inspection method 400 illustrated in a flowchart of FIG. 12. The control program illustrated in the flowchart of FIG. 12 is stored in flash memory 204 included in control device 200, and is executed by the CPU of controller 202 when an operator performs a predetermined operation on touch panel 86.

When flange inspection method 400 is executed, first, imaging process S10 is performed. In this process, suction nozzle 60 that is an inspection target is held by holding chuck 128, and suction nozzle 60 that is an inspection target held by holding chuck 128 is imaged by camera 140 from below. The imaging is performed in a state in which the lower end face of suction pipe 68 of suction nozzle 60 that is an inspection target is focused under the same exposure conditions as those in the above imaging of non-defective suction nozzle 60. Consequently, an image on which suction nozzle 60 that is an inspection target is captured is acquired.

Subsequently, cutout process S12 is performed. In this processing, the image on which suction nozzle 60 that is an inspection target is captured is equally divided into multiple regions in the same manner as image 300 of non-defective suction nozzle 60 described above, and a region in which the lower surface of flange portion 66 is hardly captured among the multiple regions equally divided is excluded from a target of the flange inspection (refer to FIG. 10). That is, in the present embodiment, the image on which suction nozzle 60 that is an inspection target is captured is automatically divided into 36 equal regions, and a total of 8 regions located at the four corners and the center of the image among the 36 equally divided regions are automatically excluded from targets of the flange inspection (refer to FIG. 13 and FIG. 14).

Subsequently, inspection process S14 is performed. This process is performed by the functions of first calculation processing section 210, second calculation processing section 212, and difference determination processing section 214 included in controller 202.

Figure 13:
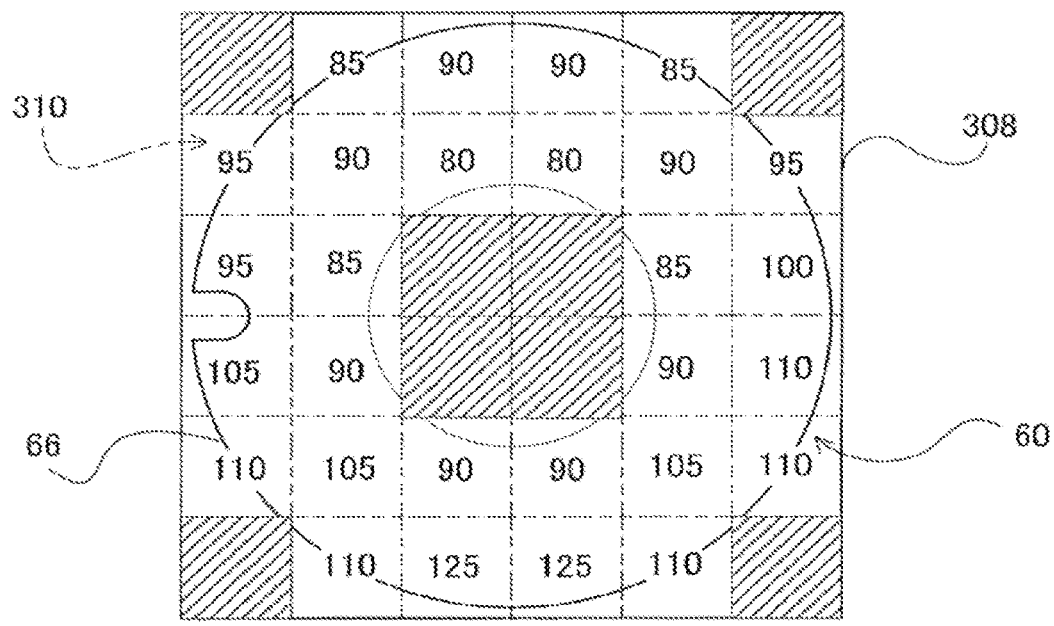
FIG. 13 is a conceptual diagram illustrating an average value of brightness values of an image acquired by the camera.

First, first calculation processing section 210 functions. Consequently, in the image on which suction nozzle 60 that is an inspection target is captured, an average value of brightness values of the image is calculated for each of multiple regions. Specifically, as illustrated in FIG. 13, in image 308 on which suction nozzle 60 that is an inspection target is captured, an average value of brightness values of image 308 is calculated for each of multiple regions 310 divided in the same manner as in image 300 of non-defective suction nozzle 60 described above, based on imaging data of image 308.

In each region 310 of image 308, an example of the average value of the brightness values of image 308 in a case where the brightness values of image 308 are represented by values (8 bits) of 0 (dark) to 255 (bright) is written. In image 308, a total of eight regions 310 located at the four corners and the center thereof are filled with a hatched pattern so as to be excluded from targets of the flange inspection.

Figure 14:
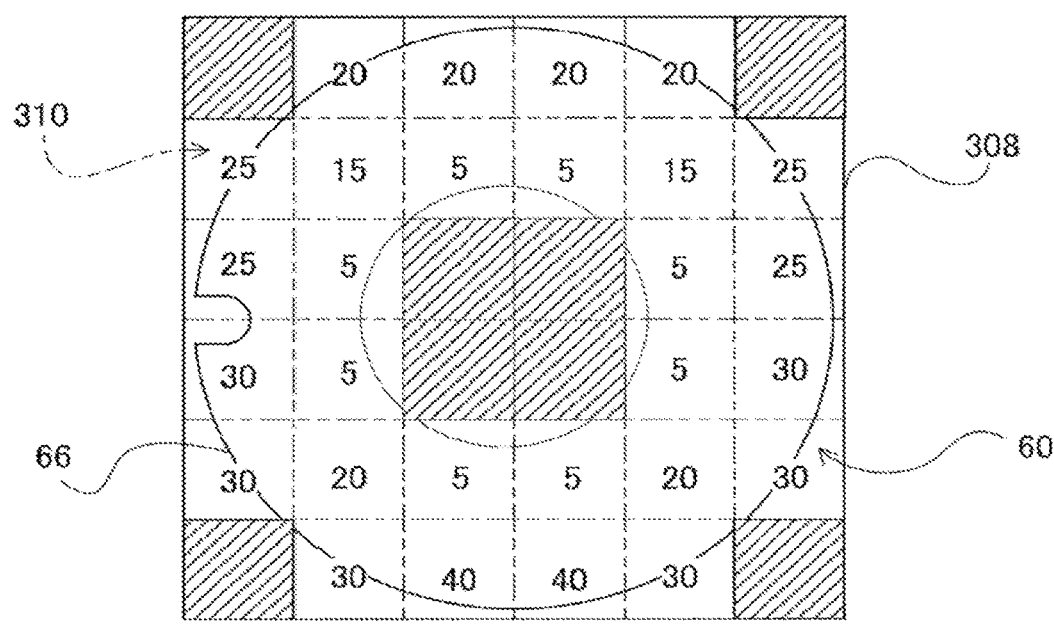
FIG. 14 is a conceptual diagram illustrating a difference between an average value and a reference value of brightness values of an image acquired by the camera.

Next, second calculation processing section 212 functions. Consequently, in the image on which suction nozzle 60 that is an inspection target is captured, a difference between the average value and a reference value of the brightness value of the image is calculated for each of multiple regions. In the calculation, each reference value stored in reference table 304 (the average value of the brightness values of image 300 calculated for each region 302 of image 300) is used. Specifically, as illustrated in FIG. 14, for each region 310 of image 308 on which suction nozzle 60 that is an inspection target is captured, a value obtained by subtracting the reference value (refer to FIG. 13) stored in the field 306 of reference table 304 in association with region 302 of image 300 corresponding to the region 310 from the average value (refer to FIG. 13) of image 308 of the region 310 is obtained.

Next, difference determination processing section 214 functions. Consequently, it is determined whether a lower surface state of flange portion 66 of suction nozzle 60 that is an inspection target is defective based on the difference calculated by second calculation processing section 212. Specifically, when the maximum value of multiple differences calculated for multiple respective regions 310 of image 308 on which suction nozzle 60 that is an inspection target is captured is smaller than a predetermined value, it is determined that the lower surface state of flange portion 66 of suction nozzle 60 that is an inspection target is normal, and suction nozzle 60 that is an inspection target is returned to nozzle tray 76 or nozzle pallet 110.

The predetermined value is set such that the lower surface of flange portion 66 of suction nozzle 60 that is an inspection target is determined as being in a normal state even if the lower surface thereof is displayed in an image brighter than non-defective suction nozzle 60 as long as acquisition of information by part camera 29 of electronic component mounting device 10 is not hindered. The setting is performed in advance by an operator operating touch panel 86 or the like. Consequently, the predetermined value is stored in flash memory 204.

In image 308 on which suction nozzle 60 that is an inspection target is captured, the lower surface or the like of flange portion 66 is captured in a defocused state. Therefore, even if the lower surface of flange portion 66 of suction nozzle 60 that is an inspection target is such a surface that, for example, scratches occur, the black plating is peeled off, and lighting light is reflected from the peeled location, as long as acquisition of information by part camera 29 of electronic component mounting device 10 is not hindered, it is determined that the lower surface state of flange portion 66 of suction nozzle 60 that is an inspection target is normal.

In contrast, if the maximum value of the multiple differences calculated for multiple respective regions 310 of image 308 on which suction nozzle 60 that is an inspection target is captured is equal to or greater than the predetermined value, it is determined that the lower surface state of flange portion 66 of suction nozzle 60 that is an inspection target is abnormal, and suction nozzle 60 that is an inspection target is discarded to discard box 148. Consequently, for example, when the lower surface of flange portion 66 is scratched to peel off the black plating, and the lighting light is reflected from the peeled location to enter a state in which acquisition of information by part camera 29 of electronic component mounting device 10 is hindered, suction nozzle 60 is discarded to discard box 148 in the flange inspection in nozzle management device 80 and is thus prevented from being used in electronic component mounting device 10.

As described above, in nozzle management device 80 of the present embodiment, the quality of flange portion 66 of suction nozzle 60 is determined through image processing using camera 140 from the viewpoint of improving image recognition of an electronic component picked up and held by suction nozzle 60 (information acquisition by part camera 29 of electronic component mounting device 10).

In the present embodiment, nozzle management device 80 is an example of an inspection device for an suction nozzle. Camera 140 is an example of an imaging device. Flash memory 204 is an example of a storage device. Each reference value stored in reference table 304 (the average value of the brightness values of image 300 calculated for each region 302 of image 300) is an example of a division reference value. Flange inspection method 400 is an example of an inspection method for a suction nozzle. Imaging process S10 is an example of an imaging step. Inspection process S14 is an example of an inspection step.

Figure 15:
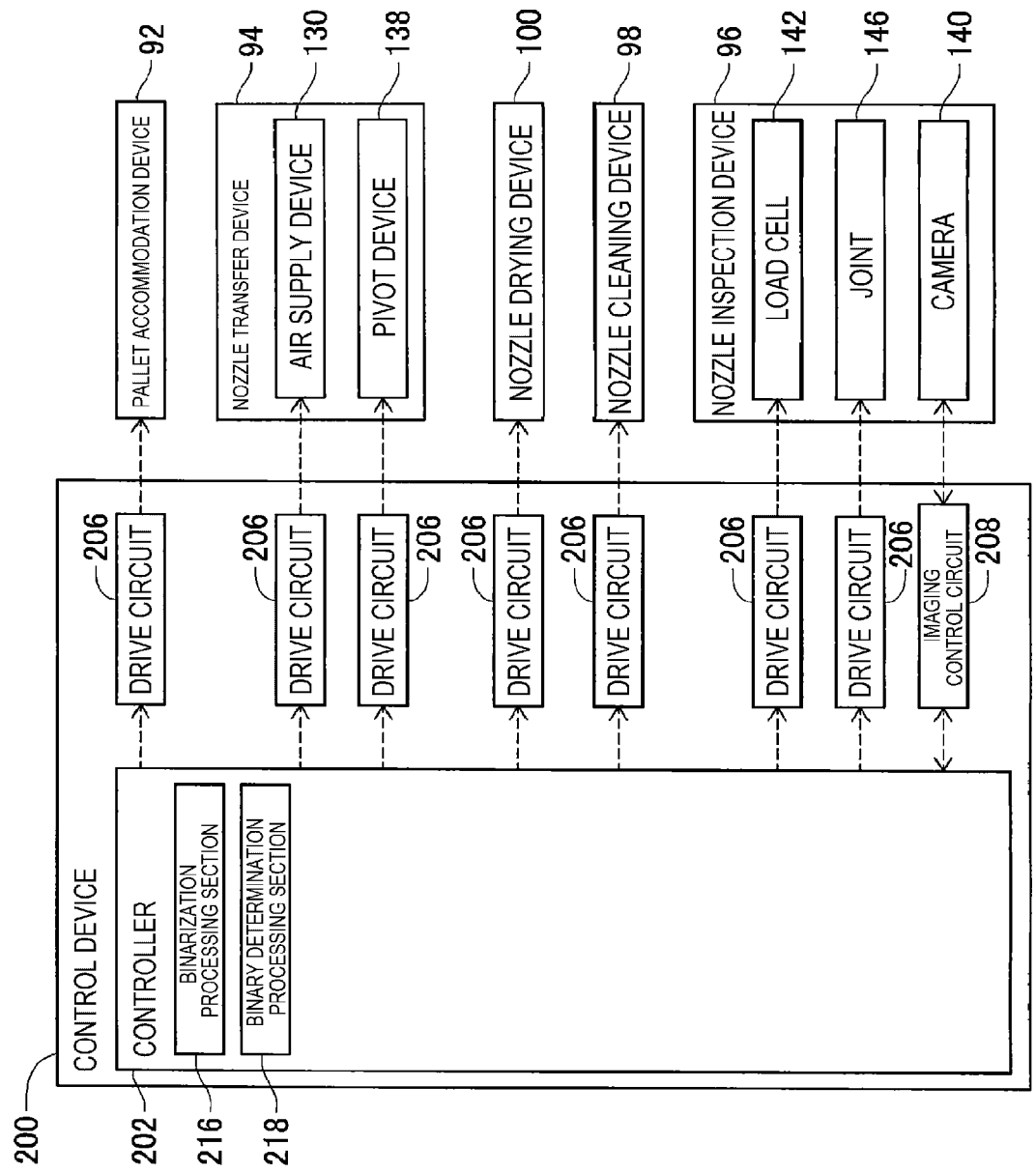
FIG. 15 is a block diagram illustrating the control device provided in the nozzle management device.

The present disclosure is not limited to the above embodiment, and various modifications can be made within the scope without departing from the concept of the present disclosure. For example, controller 202 of nozzle management device 80 may include, instead of first calculation processing section 210, second calculation processing section 212, and difference determination processing section 214 described above, binarization processing section 216 and binarization determination processing 218, for example, as illustrated in FIG. 15. In such a case, inspection process S14 of flange inspection method 400 is performed by functions of binarization processing section 216 and binarization determination processing 218.

First, when binarization processing section 216 functions, an image on which suction nozzle 60 that is an inspection target is captured is converted into two grayscales (2 bits of 0 or 1) by comparing a brightness value and a threshold value for each pixel.

Next, when binarization determination processing 218 functions, for example, the number of pixels converted into bright grayscales is counted, and if the counted number of pixels is smaller than a predetermined number, it is determined that a lower surface state of flange portion 66 of suction nozzle 60 that is an inspection target is normal, and thus suction nozzle 60 that is an inspection target is returned to nozzle tray 76 or nozzle pallet 110. In contrast, when the counted number of pixels is equal to or larger than the predetermined number, it is determined that the lower surface state of flange portion 66 of suction nozzle 60 that is an inspection target is abnormal, and thus suction nozzle 60 that is an inspection target is discarded to discard box 148.

The threshold value used in binarization processing section 216 and the predetermined number used in binarization determination processing 218 are set in the same manner as the predetermined value used in difference determination processing section 214 described above. That is, the threshold value and the predetermined number are set such that the lower surface of flange portion 66 of suction nozzle 60 that is an inspection target is determined as being in a normal state even if the lower surface thereof is displayed in an image brighter than non-defective suction nozzle 60 as long as acquisition of information by part camera 29 of electronic component mounting device 10 is not hindered. The setting is performed in advance by an operator operating touch panel 86 or the like. Consequently, the threshold value and the predetermined number are stored in flash memory 204.

Binarization determination processing 218 may count the number of pixels converted into dark grayscales. In such a case, when the counted number of pixels is equal to or larger than a predetermined number, it is determined that a lower surface state of flange portion 66 of suction nozzle 60 that is an inspection target is normal, and suction nozzle 60 that is an inspection target is returned to nozzle tray 76 or nozzle pallet 110. In contrast, when the counted number of pixels is smaller than the predetermined number, it is determined that a lower surface state of flange portion 66 of suction nozzle 60 that is an inspection target is abnormal, and thus suction nozzle 60 that is an inspection target is discarded to discard box 148.

In such a modification example, the threshold value is an example of a reference value.

In cutout process S12 of flange inspection method 400, unlike the above embodiment, a target portion of the flange inspection (specifically, the lower surface of flange portion 66 of suction nozzle 60 that is an inspection target) may be cut out from an image on which suction nozzle 60 that is an inspection target is captured. In such a case, also for an image on which non-defective suction nozzle 60 is captured, a target portion of the flange inspection (more specifically, the lower surface of flange portion 66 of non-defective suction nozzle 60) is cut out, and a reference value is calculated for each divided region with respect to the cutout portion.

In inspection process S14, the quality of flange portion 66 of suction nozzle 60 that is an inspection target may be determined through image recognition of a position, a crack, a shape, or the like of flange portion 66 of suction nozzle 60 that is an inspection target in image 308 on which suction nozzle 60 that is an inspection target is captured.

REFERENCE SIGNS LIST

60 Suction nozzle, 64 Body cylinder, 66 Flange portion, 80 Nozzle management device, 140 Camera, 200 Control device, 204 Flash memory, 210 First calculation processing section, 212 Second calculation processing section, 214 Difference determination processing section, 216 Binarization processing section, 218 Binary determination processing section, 304 Reference table, 308 Image, 310 Region, 400 Flange inspection method, S10 Imaging process, S12 Cutout process, S14 Inspection process

The invention claimed is:

1. A device for inspecting a suction nozzle comprising:
a camera configured to acquire an image by imaging a lower surface of a flange portion of the suction nozzle, the suction nozzle including a body cylinder and the flange portion protrudes from an outer surface of the body cylinder; and
a control device configured to execute an inspection process for determining whether the lower surface of the flange portion is defective based on the image.

2. The device for inspecting a suction nozzle according to claim 1, further comprising:
a storage device in which brightness values of the image in a case where the suction nozzle is a non-defective article are stored as reference values, wherein
the control device executes the inspection process by comparing the brightness values of the image in a case where the suction nozzle is an inspection target with the reference values.

3. The device for inspecting a suction nozzle according to claim 2, wherein
the storage device includes a reference table in which multiple division reference values are stored as the reference values in a state of being associated with multiple regions into which the image is divided, and
the control device includes
a first calculation processing section configured to calculate an average value of the brightness values of the image for each of the multiple regions,
a second calculation processing section configured to calculate a difference between the average value and the division reference value for each of the multiple regions, and
a difference determination processing section configured to determine whether the flange portion is defective based on a maximum value among differences calculated for the multiple regions.

4. The device for inspecting a suction nozzle according to claim 2, wherein
the control device includes
a binarization processing section configured to convert the image into two grayscales based on a magnitude relationship between the brightness values of the image and the reference values, and
a binary determination processing section configured to determine whether the flange portion is defective based on a number of pixels of the image converted into a first grayscale of the two grayscales.

5. A device for inspecting a suction nozzle comprising:
a camera configured to acquire an image by imaging a flange portion of the suction nozzle, the suction nozzle including a body cylinder and the flange portion protrudes from an outer surface of the body cylinder; and
a control device configured to execute
an inspection process for determining whether the flange portion is defective based on the image, and
a cutout process for cutting out the flange portion of the suction nozzle from the image, as a pre-process of the inspection process.

6. The device for inspecting a suction nozzle according to claim 1, wherein the flange includes an upper surface opposite to the lower surface, the upper surface including an identification code.

7. The device for inspecting a suction nozzle according to claim 1, wherein
an end of the suction nozzle includes a suction pipe configured to hold an electronic component, and
the lower surface of flange faces the suction pipe.

8. The device for inspecting a suction nozzle according to claim 1, wherein the lower surface of flange has a non-reflective black plating.

9. A method for inspecting a suction nozzle comprising:
- an imaging step of acquiring an image of a lower surface of flange portion of the suction nozzle, the suction nozzle including a body cylinder and the flange portion protruding from an outer surface of the body cylinder; and
- an inspection step of determining whether the lower surface of the flange portion is defective based on the image.

\* \* \* \* \*